USUCAS1010140058B2

United States Patent
Lin

(10) Patent No.: US 10,140,058 B2
(45) Date of Patent: Nov. 27, 2018

(54) MEMORY CONTROLLER AND MEMORY MODULE

(71) Applicant: Silicon Motion, Inc., Jhubei, Hsinchu County (TW)

(72) Inventor: Jiyun-Wei Lin, Hsinchu (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 155 days.

(21) Appl. No.: 15/165,171

(22) Filed: May 26, 2016

(65) Prior Publication Data

US 2016/0350014 A1    Dec. 1, 2016

(30) Foreign Application Priority Data

May 27, 2015   (TW) .............................. 104116935 A

(51) Int. Cl.
| | |
|---|---|
| G06F 3/00 | (2006.01) |
| G06F 3/06 | (2006.01) |
| G06F 12/02 | (2006.01) |
| G06F 11/00 | (2006.01) |

(52) U.S. Cl.
CPC ............ *G06F 3/0659* (2013.01); *G06F 3/061* (2013.01); *G06F 3/0656* (2013.01); *G06F 3/0679* (2013.01); *G06F 11/00* (2013.01); *G06F 12/02* (2013.01)

(58) Field of Classification Search
CPC ......... G06F 12/02; G06F 3/061; G06F 3/0659
See application file for complete search history.

(56) References Cited

U.S. PATENT DOCUMENTS

| | | | |
|---|---|---|---|
| 6,122,762 A * | 9/2000 | Kim ....................... | G11C 29/32 714/726 |
| 7,155,637 B2 | 12/2006 | Jarboe et al. | |
| 9,570,128 B2 * | 2/2017 | Lin ......................... | G11C 7/22 |
| 2007/0047308 A1 * | 3/2007 | Mitsunaga ............. | G11C 16/06 365/185.12 |
| 2008/0225603 A1 * | 9/2008 | Hein ..................... | G11C 7/1051 365/189.05 |
| 2010/0077267 A1 * | 3/2010 | Perego ................. | G06F 13/1678 714/716 |
| 2013/0262744 A1 | 10/2013 | Ramachandra et al. | |
| 2014/0071756 A1 | 3/2014 | Iwai et al. | |
| 2014/0281325 A1 * | 9/2014 | Meaney .............. | G06F 13/1689 711/167 |

(Continued)

*Primary Examiner* — Henry Tsai
*Assistant Examiner* — Christopher A Daley
(74) *Attorney, Agent, or Firm* — McClure, Qualey & Rodack, LLP

(57) ABSTRACT

A memory controller coupled between an external device and a memory is provided. The memory controller is coupled to the external device via a second interface and coupled to the memory via a first interface. The memory controller further includes a control logic to control the first interface and the second interface. The control logic sets the second interface to be at a receiving mode to receive a test data from the external device, and sets the first interface to be at a transmitting mode to transmit the test data to the memory. After a predetermined time, the control logic sets the first interface to be at the receiving mode to receive a test result from the memory, and sets the second interface to be at a transmitting mode to transmit the test result to the external device.

8 Claims, 7 Drawing Sheets

(56) References Cited

U.S. PATENT DOCUMENTS

| | | |
|---|---|---|
| 2015/0026530 A1 | 1/2015 | d'Abreu et al. |
| 2015/0067209 A1* | 3/2015 | Liu .................... H03K 5/22 |
| | | 710/106 |
| 2015/0074465 A1 | 3/2015 | Pfeffer et al. |

* cited by examiner

US 10,140,058 B2

MEMORY CONTROLLER AND MEMORY MODULE

CROSS REFERENCE TO RELATED APPLICATIONS

This Application claims priority of Taiwan Patent Application No. 104116935, filed on May 27, 2015, the entirety of which is incorporated by reference herein

BACKGROUND OF THE INVENTION

Field of the Invention

The invention relates to a memory controller and a memory module, and more particularly to a memory controller and a memory module with a synchronization mechanism.

Description of the Related Art

Flash memory is widely used in data storage devices, such as memory cards, USB flash devices, and SSDs, among others. The flash memory is also applied in an eMMC (embedded multimedia card) module. The eMMC module is a multi-chip packaged device where the flash memory chips and the controller chip are integrated.

The embedded multimedia card module generally uses a BGA (ball grid array) package, but now, the multi-chip package (eMCP) has been widely adopted in the embedded multimedia card module. The multi-chip package integrates memory, such as DDR RAM, and the eMMC module, in one package structure. This makes the embedded multimedia card module thinner and more easily adopted for use in portable devices.

The embedded flash memory module using the multi-chip package or the multi-chip packaged chip with DDR RAM needs a test pin from the circuit board for testing by an external testing device. The disadvantage of the testing mechanism is the slow testing speed. Furthermore, to reduce the number of I/O ports, a common interface is usually adopted. The common interface will slow down the testing speed and may cause timing errors. Furthermore, the debug circuit is at the last stage in the traditional embedded memory module, and this design easily causes errors due to data jitter.

BRIEF SUMMARY OF THE INVENTION

An embodiment of the invention provides a memory controller. The memory controller is coupled between an external device and a memory. The memory controller comprises a first interface, a second interface and control logic. The first interface communicates with the memory. The second interface communicates with the external device. The control logic controls the first interface and the second interface. The control logic sets the second interface to be at a receiving mode to receive test data from the external device, sets the first interface to be at a transmitting mode to transmit the test data to the memory, after a predetermined time, the control logic sets the first interface to be at the receiving mode to receive a test result from the memory, and sets the second interface to be at the transmitting mode to transmit the test result to the external device.

Another embodiment of the invention provides a memory controller coupled between an external device via a second interface, and a memory via a first interface. The memory controller comprises a first buffer, a first synchronization unit, a second buffer, a second synchronization unit and a control logic. The first buffer is coupled to the memory via the first interface. The first synchronization unit is coupled to the first buffer. The second buffer is coupled to the external device via the second interface. The second synchronization unit is coupled to the second buffer. The control logic sets the second interface to be at a receiving mode to receive test data from the external device, sets the first interface to be at a transmitting mode to transmit the test data to the memory, after a predetermined time, the control logic sets the first interface to be at the receiving mode to receive a test result from the memory, and sets the second interface to be at the transmitting mode to transmit the test result to the external device.

Another embodiment of the invention provides a memory module coupled to an external device via a second interface. The memory module comprises a memory and a memory controller. The memory controller comprises a first buffer, a first synchronization unit, a second buffer, a second synchronization unit and a control logic. The first buffer is coupled to the memory via the first interface. The first synchronization unit is coupled to the first buffer. The second buffer is coupled to the external device via the second interface. The second synchronization unit is coupled to the second buffer. The control logic sets the second interface to be at a receiving mode to receive test data from the external device, sets the first interface to be at a transmitting mode to transmit the test data to the memory, after a predetermined time, the control logic sets the first interface to be at the receiving mode to receive a test result from the memory, and sets the second interface to be at the transmitting mode to transmit the test result to the external device.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
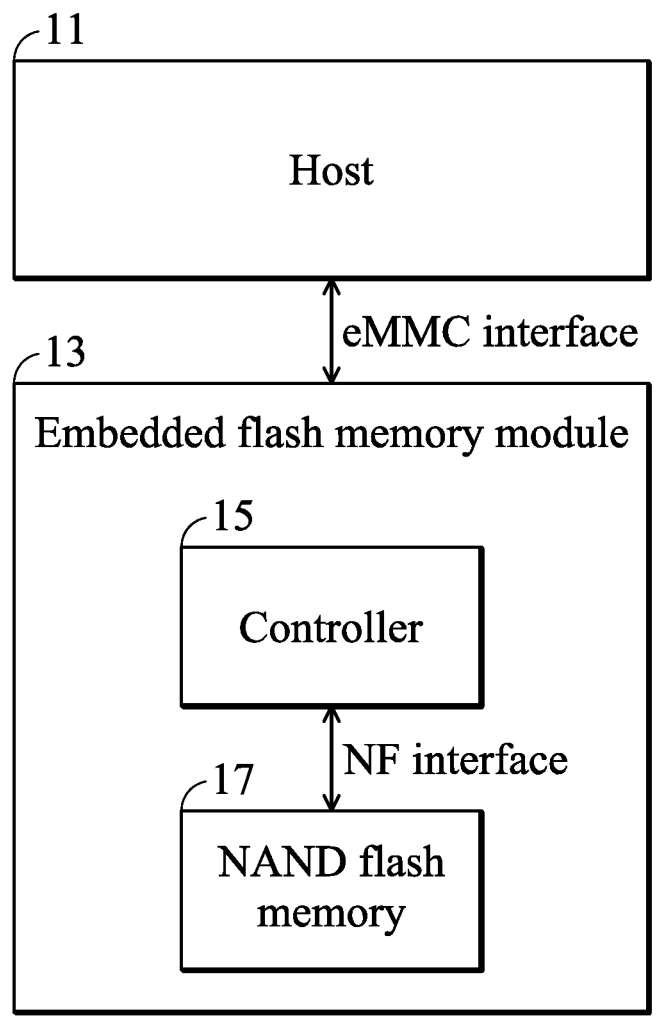
FIG. 1 is a schematic diagram showing an operation of an embedded flash memory module.

FIG. 1 is a schematic diagram showing an operation of an embedded flash memory module. FIG. 1 illustrates an embedded flash module but does not limit the invention thereto. Any memory module can be applied to the embodiment of FIG. 1, especially to the memory controller of memory module having two different interfaces. In the embodiment of FIG. 1, the controller 15 communicates with the host 11 via an eMMC interface and reads/writes the NAND flash memory 17 via a NF (NAND flash) interface.

In FIG. 1, the host 11 transmits instructions or data to the embedded flash memory module 13 via the eMMC interface. When the controller 15 receives instructions from the host 11, the controller may write data to the NAND flash memory 17 or read data from the NAND flash memory 17 and transmit read data to the host 11.

Since the embedded flash memory module 13 is a multi-chip packaged device, an external testing device is required to determine whether the embedded flash memory module 13 is operating correctly. The external testing device determines whether the data read from the NAND flash memory 17 or written to the NAND flash memory 17 is correct.

Figure 2:
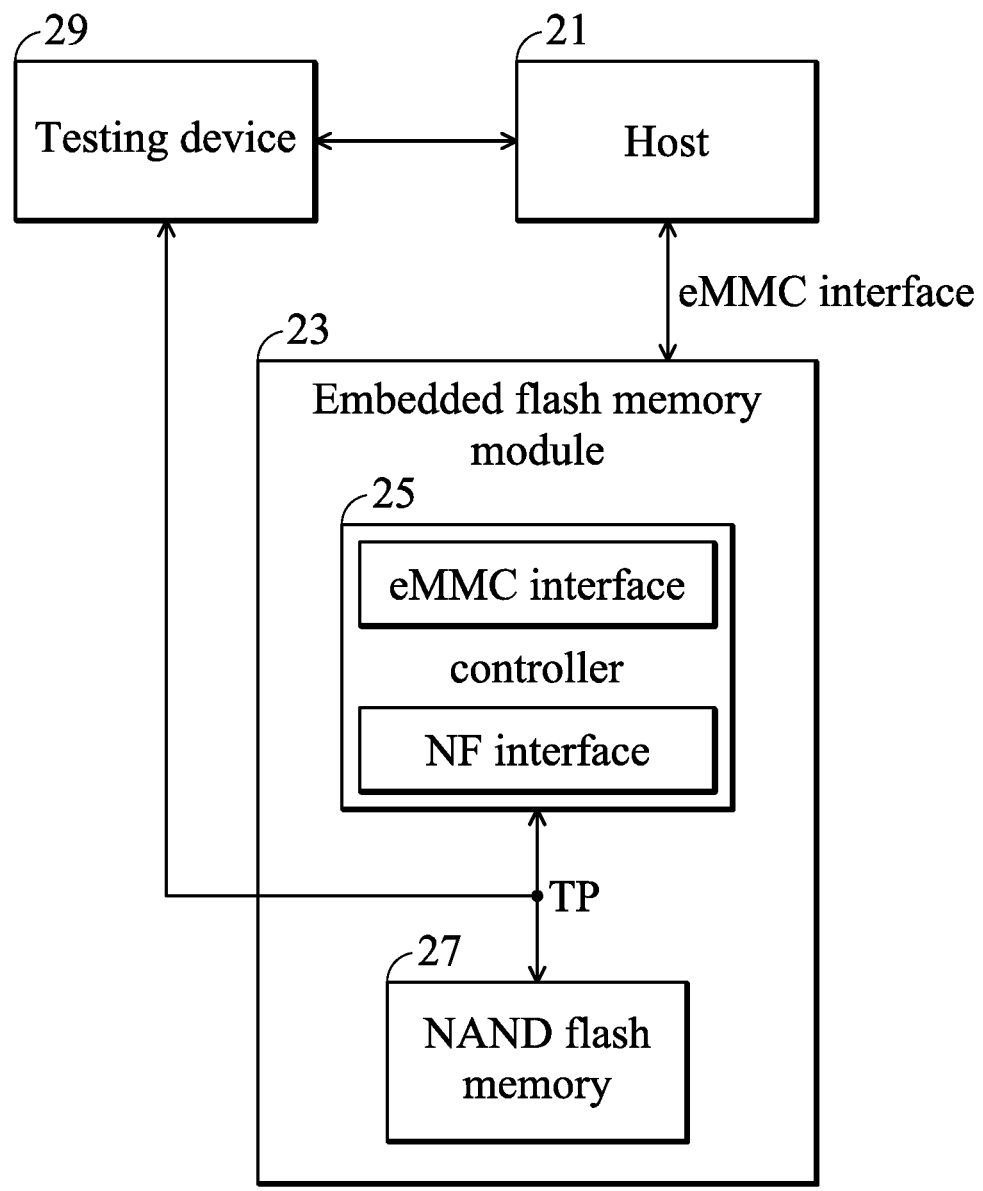
FIG. 2 is a schematic diagram showing a test function of an embedded flash memory module.

FIG. 2 is a schematic diagram showing a test function of an embedded flash memory module. In this embodiment, the controller 25 communicates with the host 21 via the eMMC interface and the NAND flash memory 27 via the NF (NAND flash) interface. To ensure the embedded flash memory module 23 is operating correctly, a test point TP in a transmission path between the controller 25 and the NAND flash memory 27 is provided to the testing device 29 to determine whether the embedded flash memory module 23 is operating correctly.

When the host 21 transmits data or instructions to the embedded flash memory module 23 via the eMMC interface to write data to the NAND flash memory 27, the controller 25 receives the instructions and the data from the host 21 and writes the data to the NAND flash memory 27. The testing device 29 reads the data that the controller will write to the NAND flash memory 27 from the test point TP to determine whether the data to be written to the NAND flash memory 27 is correct. When the host 21 transmits data or instructions to the embedded flash memory module 23 via the eMMC interface to read data from the NAND flash memory 27, the testing device 29 reads the data which the NAND flash memory 27 returns from the test point TP and compares the read data and the data which the host 21 received to determine whether the data received by the host 21 is correct.

The interface described in FIG. 2 and in the following figures, such as the eMMC interface and the NF interface, means a communication mechanism provided by the controller 25 to the testing device 29 and the NAND flash memory 27. The interface may be implemented by hardware circuitry, software, or firmware.

The test method described in FIG. 2 is easy and effective, but the test results may be in error because the data read from the test point TP may be unsynchronized, especially when the operation frequency of the embedded flash memory module 23 becomes faster. The high frequency easily causes data jitter, and the testing device 29 may not read the correct data. If the clock of the controller 25 cannot synchronize with the clock of testing device 29, the testing device may wrongly determine the condition of the embedded flash memory module 23. To solve this issue, a proposed testing mechanism is provided in FIG. 3.

Figure 3:
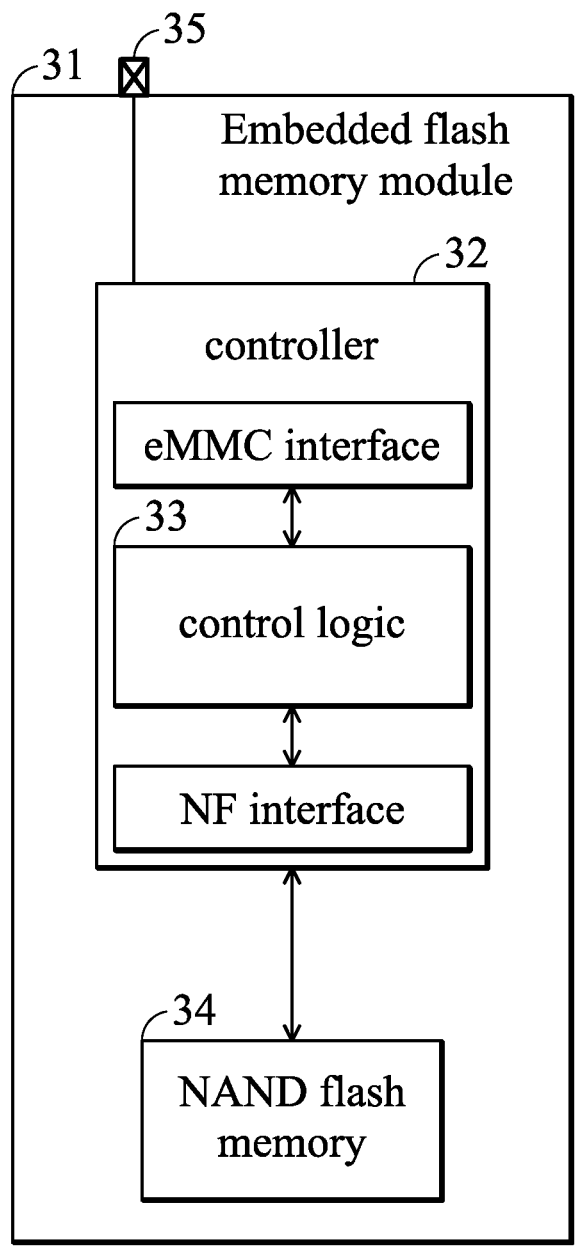
FIG. 3 is a schematic diagram of an embedded flash module with synchronization mechanism according to an embodiment of the invention.

FIG. 3 is a schematic diagram of an embedded flash module with synchronization mechanism according to an embodiment of the invention. The embedded flash module 31 comprises a controller 32, a NAND flash memory 34 and an I/O pin 35. The controller 32 communicates with the device coupled to the I/O pin 35 via the eMMC interface, and accesses the NAND flash memory 34 via NF (NAND Flash) interface.

The controller 32 further comprises a control logic 33 which may be a logic circuit or a firmware executed by the controller 32. When testing the embedded flash module 31, the controller 32 operates in a debug mode. The control logic 33 receives test data from an external testing device via the I/O pin 35 and returns a test result to the external testing device via the I/O pin 35. The control logic 33 further synchronizes the clock of the eMMC interface and the clock of the NF interface to increase the testing speed. Generally speaking, the operation clock of the NAND flash memory 34 is faster than the operation clock of the embedded flash module 31. Assuming that the embedded flash module 31 can be triggered at a rising edge and a falling edge of the operation clock, the embedded flash module 31 is able to transmit test data to the NAND flash memory 34 at the rising edge and receives a test result at the falling edge of the same clock. In other words, the logic circuit 33 transmits the test data to the NAND flash memory 34 via the NF interface at the rising edge, and receives the test result at the falling edge of the same clock. The detail can be referred to FIG. 4.

Figure 4:
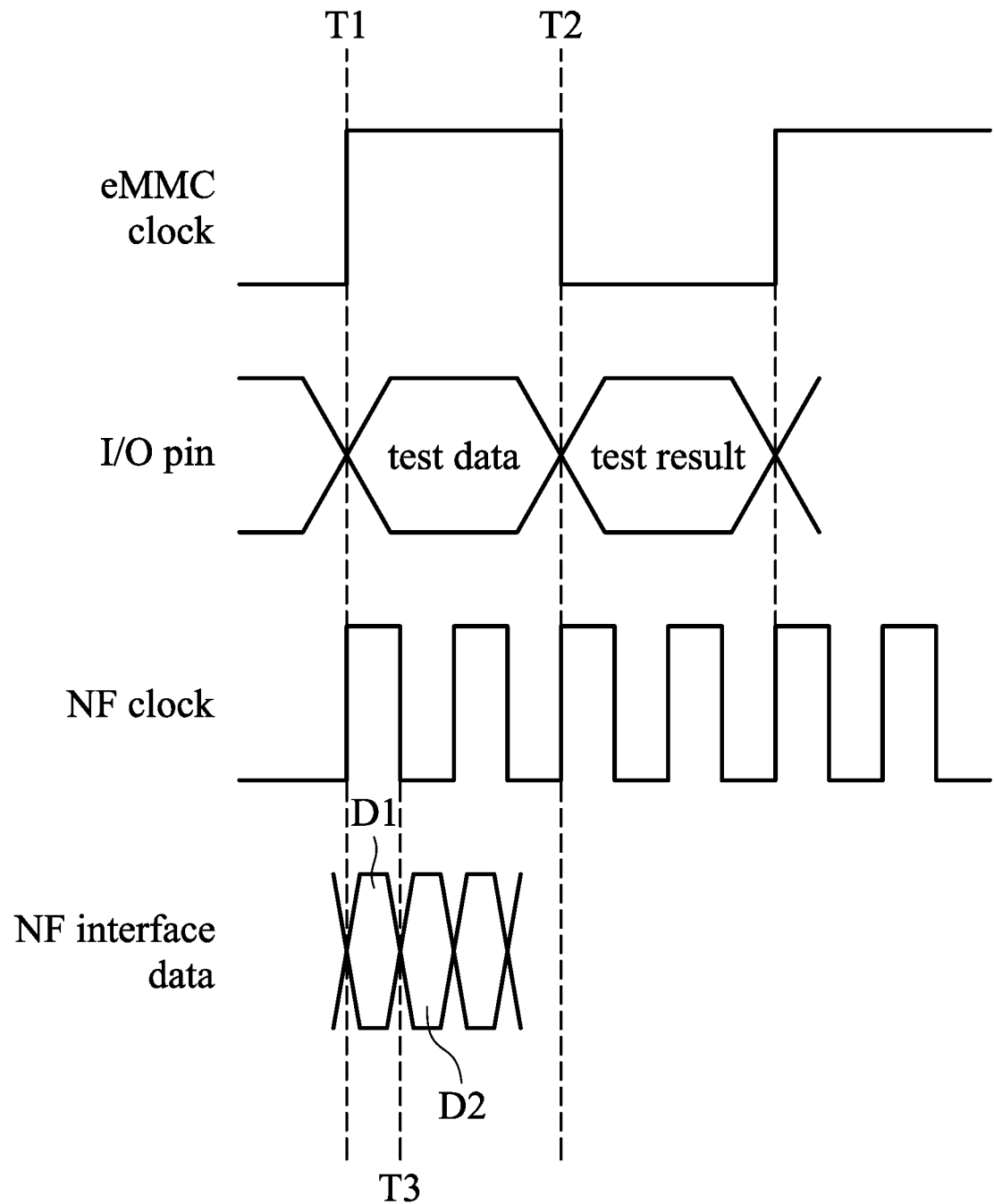
FIG. 4 is a waveform of the embedded flash module of FIG. 3.

FIG. 4 is a waveform of the embedded flash module of FIG. 3. In FIG. 4, the eMMC clock is the operation clock of the embedded flash module 31, the NF clock is the operation clock of the NAND flash memory 34, the NF interface data is the data transmitted between the control logic 33 and the NAND flash memory 34. At time T1, the embedded flash module 31 is triggered to receive test data from an external testing device. The I/O terminal 35 receives the test data at the duration between time T1 and T2. When the control logic 33 receives the test data, the control logic 33 transmits the test data to the NAND flash memory 34 via the NF interface. Thus, the NF interface data D1 shown in FIG. 4 is the test data. At time T3, the NAND flash memory 34 returns a test result labeled as D2 in FIG. 4. Since the eMMC clock is still at the high logic level, the control logic 33 transmits the data D2 to the external testing device until time T2. According to the described operation, the control logic 33 can increase a testing speed of the embedded flash module 31 and avoids the data error by directly accessing data from a testing pin, such as TP in FIG. 2.

Figure 5:
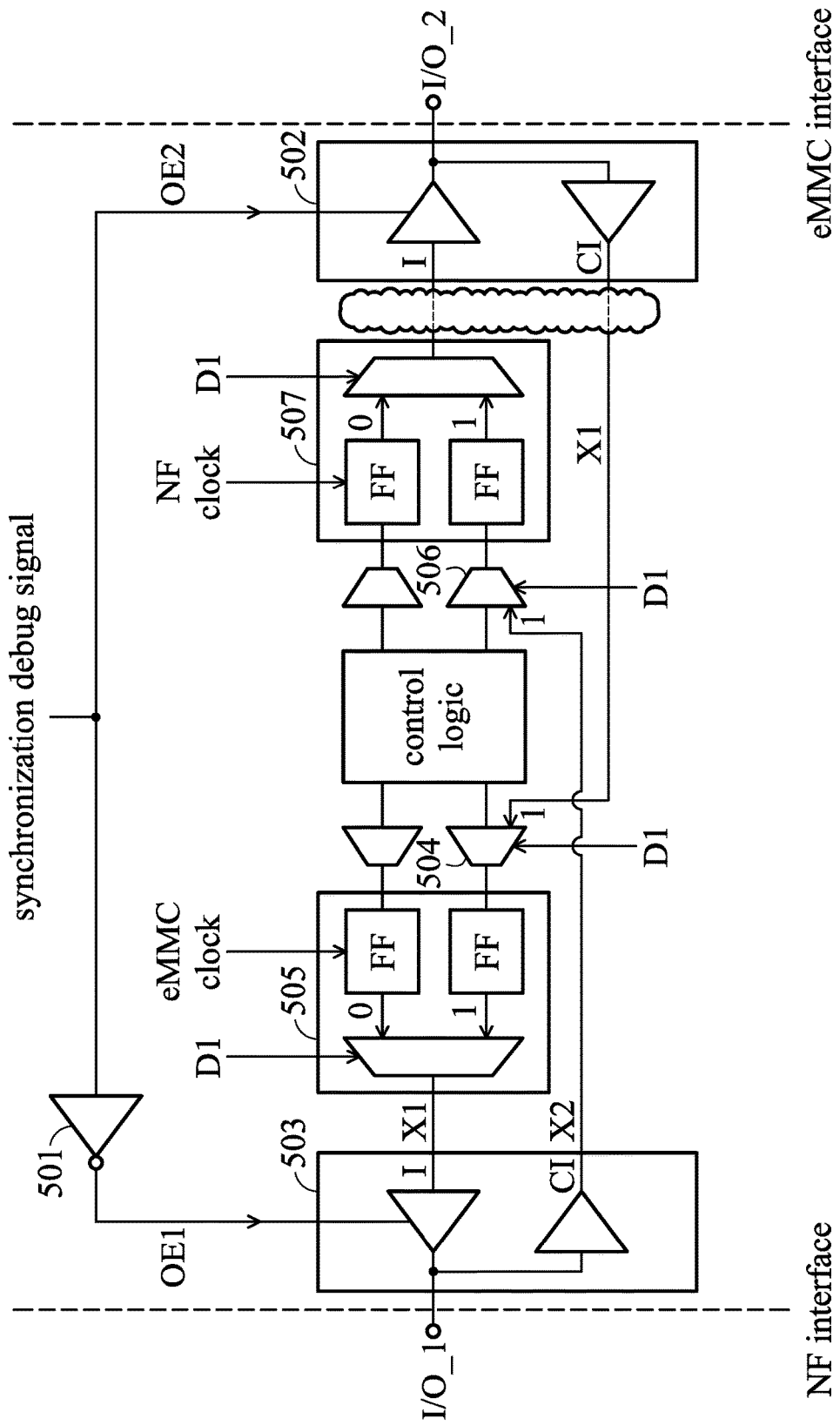
FIG. 5 is a circuit diagram of a memory controller with clock synchronization mechanism according to an embodiment of the invention.

FIG. 5 is a circuit diagram of a memory controller with clock synchronization mechanism according to an embodiment of the invention. The embodiment of FIG. 5 discloses only part circuit of a memory controller, and a person skilled in the art is understood to modify the circuit according to design requirements by the teaching from the embodiment of FIG. 5. In FIG. 5, the synchronization debug signal controls the data to be transmitted to the NF interface from the eMMC interface or to the eMMC interface from the NF interface. In this embodiment, the synchronization debug signal is the output enable signal OE2 of the buffer 502, and after the synchronization debug signal is converted by a converter 501, the converted signal is regarded as the output enable signal OE1 of the buffer 503.

When the debug procedure is processed, the synchronization debug signal is at a first logic level. The output enable signal OE2 controls the buffer 502 not to output data and the buffer 502 can only receive data input from an external source. The test data X1 is transmitted to the buffer 502 via the I/O terminal I/O_2 and the eMMC interface. Then, the buffer 502 transmits the test data X1 to the multiplexer 504 via an internal terminal CI. In this embodiment, when the debug procedure is executed, the memory controller operates in a debug mode. The debug signal D1 controls the multiplexer 504 to output test data X1 to the first synchronization unit 505. The operation clock of the first synchronization unit 505 is the same as the operation clock signal, labeled as eMMC clock in FIG. 5, of the eMMC interface, and the first synchronization unit 505 transmits test data X1 to an external transmitting terminal I of the buffer 503 according to the eMMC clock and the debug signal D1. The output enable signal OE1 controls the buffer 503 to output the test data X1, received from the transmitting terminal I of the buffer 503, to the memory via the I/O terminal I/O_1 and the NF interface.

When the synchronization debug signal is at a second logic level, the output enable signal OE1 controls the buffer 503 not to output data, and the buffer 503 can only receive data. The test result X2 is transmitted to the buffer 503 via the I/O terminal I/O_2 and the NF interface. Then, the buffer 503 transmits the test result X2 to the multiplexer 506 via an internal transmitting terminal labeled as CI in FIG. 5. The debug signal D1 controls the multiplexer 506 to output the test result X2 to the second synchronization unit 507.

The operation clock of the second synchronization unit 507 is the same as the operation clock signal, labeled as NF clock in FIG. 5, of the NF interface, and the second synchronization unit 507 transmits the test result X2 to the external transmitting terminal I of the buffer 502 according to the eMMC clock and the debug signal D1. The output enable signal OE2 controls the buffer 502 to output the test result X2, received from the transmitting terminal I of the buffer 502, to the external testing device via the I/O terminal I/O_2 and the eMMC interface.

Figure 6:
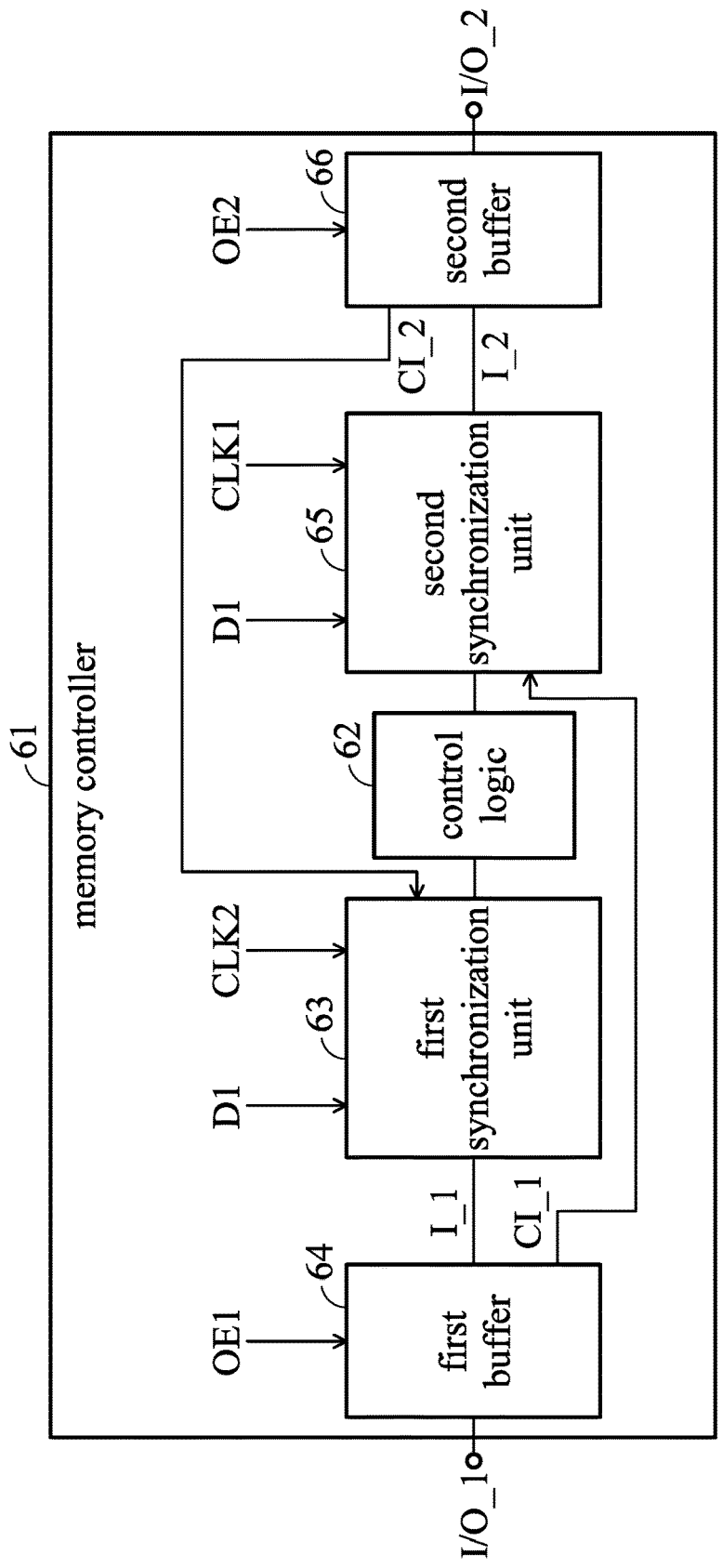
FIG. 6 is a schematic diagram of a memory controller of a memory module according to an embodiment of the invention.

FIG. 6 is a schematic diagram of a memory controller of a memory module according to an embodiment of the invention. The memory controller 61 is coupled to a memory (not shown in FIG. 6) and is able to communicate with an external device (not shown in FIG. 6). In this embodiment, the clock signal CLK1 is an operation clock of the memory, the clock signal CLK2 is an operation clock of the memory module, and the frequency of the clock signal CLK1 is higher than the frequency of the clock signal CLK2. When the memory operates in a debug mode, a debug signal D1 is generated. The debug signal D1 may be input from an external device or generated by the control logic 62.

An output enable signal OE2 controls the second buffer 66. When the output enable signal OE2 is at a first logic level, the second buffer 66 can only receive data, and cannot output data. When the output enable signal OE2 is at a second logic level, the second buffer 66 can only output data, and cannot receive data. An output enable signal OE1 controls the first buffer 64. When the output enable signal OE1 is at a first logic level, the first buffer 64 can only output data, and cannot receive data. When the output enable signal OE1 is at a second logic level, the first buffer 64 can only receive data, and cannot output data.

When the output enable signal OE2 is at the first logic level, the second buffer 66 receives test data from an I/O terminal I/O_2, and transmits the test data to the first synchronization unit 63. The first synchronization unit 63 transmits the test data to an output terminal I_1 of the first buffer 64 according to the clock signal CLK2 and the debug signal D1. Because the output enable signal OE1 is at the second logic level, the second buffer 66 transmits the test data received via the output terminal I_1 to the I/O terminal I/O_1.

When the output enable signal OE1 is at the first logic level, the first buffer 64 receives test result from an I/O terminal I/O_1, and transmits the test result to the second synchronization unit 65 via an internal output terminal CI_1. The second synchronization unit 65 transmits the test result to an output terminal I_2 of the second buffer 66 according to the clock signal CLK1 and the debug signal D1. Because the output enable signal OE1 is at the second logic level, the second buffer 66 transmits the test result received via the output terminal I_2 to the I/O terminal I/O_2.

Figure 7:
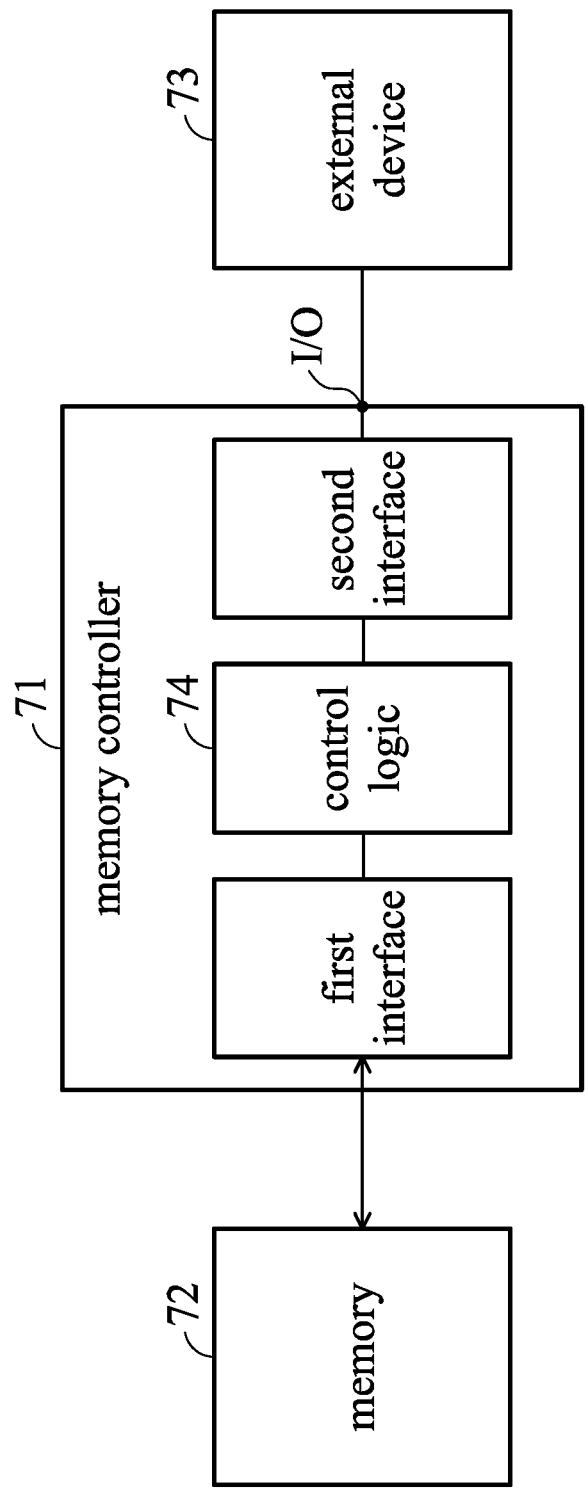
FIG. 7 is a schematic diagram of a memory controller according to another embodiment of the invention.

FIG. 7 is a schematic diagram of a memory controller according to another embodiment of the invention. The memory controller 71 is coupled to a memory 72 via a first interface and is coupled to an external device 73 via I/O port and a second interface. When the external device 73 tests the memory 72, the control logic 74 sets the second interface to be a receiving mode to receive test data from the external device 73. The control logic 74 also sets the first interface to be a transmitting mode to transmit test data to the memory 72. Then, after a predetermined duration, the control logic 74 sets the first interface to be at the receiving mode to receive a test result from the memory 72 and sets the second interface to be at the transmitting mode to transmit the test result to the external device 73.

In one embodiment, the first interface comprises a first buffer and a first synchronization unit, and the second interface comprises a second buffer and a second synchronization unit. For a detailed description of the first buffer, the first synchronization unit, the second buffer and the second synchronization unit, refer to the description of FIG. 6.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory controller coupled between an external device and a memory, comprising:
 a first interface to communicate with the memory, the first interface comprising:
  a first buffer coupled to the memory; and
  a first synchronization unit coupled to the first buffer;
 a second interface to communicate with the external device, the second interface comprising:
  a second buffer coupled to the external device; and
  a second synchronization unit coupled to the second buffer; and
 a control logic,
 wherein in response to a synchronization debug signal being at a first logic level, the control logic sets the second buffer of the second interface to be at a receiving mode according to the synchronization debug signal to receive test data from the external device and transmit the test data to the first synchronization unit, and the control logic sets the first buffer of the first interface to be at a transmitting mode according to an inverted synchronization debug signal to transmit the test data from the first synchronization unit to the memory, and
 wherein after a predetermined time, in response to the synchronization debug signal being at a second logic level, the control logic sets the first buffer of the first interface to be at the receiving mode to receive a test result from the memory and transmit the test result to the second synchronization unit, and the control logic sets the second buffer of the second interface to be at the transmitting mode to transmit the test result from the second synchronization unit to the external device, wherein the first synchronization unit and the second buffer are operated at a second clock, and the second synchronization unit and the first buffer are operated at a first clock.

2. A memory module coupled to an external device via a second interface, comprising:
- a memory; and
- a memory controller as claimed in claim 1.

3. The memory module as claimed in claim 2, wherein the first interface is set be at the transmitting mode or the receiving mode by a synchronization debug signal, the second interface is set be at the transmitting mode or the receiving mode by an inverted synchronization debug signal.

4. The memory module as claimed in claim 2, wherein the first synchronization unit and the second interface share a second clock signal, and the second synchronization unit and the first interface share a first clock signal.

5. The memory controller as claimed in claim 1, wherein the first logic level is a low logic level, and the second logic level is a high logic level.

6. The memory controller as claimed in claim 1, wherein the control logic issues a debug signal to the first synchronization unit and the second synchronization unit, wherein the first synchronization outputs the test data to the first buffer in response to the debug signal being in a high logic level, wherein the second synchronization output the test result to the second buffer in response to the debug signal being in a high logic level.

7. The memory controller as claimed in claim 1, wherein the frequency of the first clock is higher than that of the second clock.

8. The memory controller as claimed in claim 7, wherein the predetermined time is half a clock cycle of the first clock.

* * * * *